US012255598B2

(12) United States Patent
Cappello (10) Patent No.: US 12,255,598 B2
(45) Date of Patent: Mar. 18, 2025

(54) INTERLEAVED CIC FILTER (71) Applicant: INVENSENSE, INC., San Jose, CA (US)

(72) Inventor: Stefano Cappello, Milan (IT)

(73) Assignee: InvenSense, Inc., San Jose, CA (US)

( * ) Notice: Subject to any disclaimer, the term of this patent is extended or adjusted under 35 U.S.C. 154(b) by 912 days.

(21) Appl. No.: 17/379,089

(22) Filed: Jul. 19, 2021

(65) Prior Publication Data

US 2023/0017433 A1    Jan. 19, 2023

(51) Int. Cl.
H03H 17/06 (2006.01)

(52) U.S. Cl.
CPC .... *H03H 17/0671* (2013.01); *H03H 17/0664* (2013.01); *H03H 2017/0678* (2013.01)

(58) Field of Classification Search
CPC ........... H03H 17/0248; H03H 17/0671; H03H 17/0664; H03H 2017/0678; H03M 1/1215
See application file for complete search history.

(56) References Cited

U.S. PATENT DOCUMENTS

| 7,358,884 B1 | 4/2008 | Heyl et al. | |
| 7,613,760 B1* | 11/2009 | Esposito | H03H 17/0223 708/313 |
| 7,788,309 B2 | 8/2010 | Wu et al. | |
| 8,645,441 B2 | 2/2014 | Willson | |
| 10,115,386 B2 | 10/2018 | Chan et al. | |
| 2007/0230642 A1* | 10/2007 | Wu | H03H 17/0671 375/350 |
| 2011/0103593 A1 | 5/2011 | Sutharsan et al. | |
| 2017/0222627 A1* | 8/2017 | Kajita | H03H 17/0671 |
| 2017/0243624 A1* | 8/2017 | Foong | G11C 11/1659 |

FOREIGN PATENT DOCUMENTS

JP    2003234638 A  *  8/2003

OTHER PUBLICATIONS

Zwyssig, Erich. "Digital Microphone Array." Master's thesis, University of Edinburgh, 2009 (Year: 2009).*
F. Khoshnoud and C. W. de Silva, "Recent advances in MEMS sensor technology-mechanical applications," in IEEE Instrumentation & Measurement Magazine, vol. 15, No. 2, pp. 14-24, Apr. 2012 (Year: 2012).*
Y. Wang, Y. Liu, X. Zhou, A. Wang, B. Cao and F. Lai, "An on-chip signal conditioning delta-sigma ADC for micro-mechanical gyroscope applications," 2017 IEEE 12th International Conference on ASIC (ASICON), Guiyang, China, 2017, pp. 48-51 (Year: 2017).*

* cited by examiner

*Primary Examiner* — Matthew D Sandifer
(74) *Attorney, Agent, or Firm* — Van Hoven PC; Joshua Van Hoven; Stefan D. Osterbur (57) ABSTRACT An interleaved cascaded integrator-comb ("CIC") filter receives an interleaved sensor output signal, including a plurality of digitized sensor signals at an input clock rate. An integrator of the interleaved CIC filter processes the interleaved signal to output an integrated interleaved signal. A downsampler of the interleaved CIC filter buffers portions of the integrated interleaved corresponding to a decimation rate for the interleaved signal. The portions of the signals are provided to a comb filter, which outputs a decimated interleaved signal.

19 Claims, 7 Drawing Sheets

FIG. 7

INTERLEAVED CIC FILTER

BACKGROUND

Mobile and smart devices are proliferating to ever more environments, enabling scores of applications such as navigation, fitness tracking, home automation, and vehicular controls. Microelectromechanical system (MEMS) sensors provide a multitude of measurements in extremely small packaging and in a wide variety of devices and end-use environments. For example, MEMS microphones, pressure sensors, accelerometers, gyroscopes, and ultrasonic sensors are able to monitor sound and voice commands, pressure, linear acceleration, angular velocity, and external physical proximity and structure. As MEMS sensors are placed into increasingly diverse and challenging environments, and used for increasingly critical functions such as vehicle navigation and control, MEMS sensors must provide high performance despite strict limitations on size and power consumption.

A sensor such as a MEMS sensor may often output multiple signals, such as multiple axes of a MEMS accelerometer, multiple axes of a MEMS gyroscope, multiple pressure or microphone signals, multiple ultrasonic signals, and combinations thereof. The underlying output signals may be initially acquired at a particular sampling rate, for example, corresponding to a high-frequency carrier or excitation signal, while the underlying signals may have their own frequency response in some instances. The signals are then processed, such as by filters, demodulators, analog-to-digital converters ("ADC"), decimators such as cascaded integrator-comb filter ("CIC") decimators, and/or gain/offset/scaling ("GOS") circuitry. The resulting output signal may be a digital signal at an appropriate sampling rate and signal level corresponding to the measured value for analysis and processing by other circuitry and/or components.

SUMMARY

In some embodiments of the present disclosure, a device for processing interleaved signals comprises an integrator configured to receive an interleaved signal and output an integrated interleaved signal, wherein the interleaved signal comprises a plurality of digital signals interleaved at an input clock rate. The device may also comprise a downsampler coupled to the integrator to receive the integrated interleaved signal and buffer a portion of each of the digital signals of the integrated interleaved signal, and a comb filter coupled to the downsampler to receive the portions of the digital signals and to output a decimated interleaved signal corresponding to the portions of the digital signals interleaved at clock rate corresponding the input clock rate divided by a decimation rate.

In an embodiment of the present disclosure, a method for processing interleaved signals comprises, at an integrator, receiving an interleaved signal comprising a plurality of digital signals interleaved at an input clock rate and integrating the interleaved signal to generate an integrated interleaved signal. The method may further comprise, at a downsampler, receiving the integrated interleaved signal, a portion of each of the digital signals of the integrated interleaved signal, and interleaving the portions of the digital signal at a decimated clock rate corresponding the input clock rate divided by a decimation rate. The method may further comprise, at a comb filter, receiving the interleaved portions of the digital signals, filtering the interleaved portions of the digital signals, and outputting a decimated interleaved signal based on the filtered interleaved portions of the digital signals.

In an embodiment of the present disclosure, a system comprises a plurality of sensors, wherein each of the plurality sensors outputs a respective analog sensor signal. The system may further comprise a multiplexer configured to generate an interleaved analog signal from the respective analog sensor signals. The system may further comprise an analog-to-digital converter configured to generate an interleaved digital signal from the interleaved analog signal and an integrator configured to receive the interleaved digital signal and output an integrated interleaved signal, wherein the interleaved digital signal comprises a plurality of digital signals interleaved at an input clock rate. The system may further comprise a downsampler coupled to the integrator to receive the integrated interleaved signal and buffer a portion of each of the digital signals of the integrated interleaved signal, and a comb filter coupled to the downsampler to receive the portions of the digital signals and to output a decimated interleaved signal corresponding to the portions of the digital signals interleaved at clock rate corresponding the input clock rate divided by a decimation rate.

BRIEF DESCRIPTION OF DRAWINGS

The above and other features of the present disclosure, its nature, and various advantages will be more apparent upon consideration of the following detailed description, taken in conjunction with the accompanying drawings in which.

DETAILED DESCRIPTION OF DRAWINGS

Sensors and other devices may output a variety of signals for further processing such as filtering, decimation, gain/offset/scaling, and other related processing steps depending on the particular end-use application. In many such applications, the underlying data is "oversampled," e.g., the original sampling rate of the signals (e.g., sensor outputs) is such that subsets or portions of the underlying signal contain adequate information regarding the underlying signal source (e.g., a force being measured by a sensor). Devices such as sensors are often provided in packages that measure multiple underlying sources simultaneously, such as multiple or multi-axis MEMS accelerometers and/or MEMS gyroscopes, arrays of MEMS microphones, radio antenna arrays, and arrays of piezo micromachined ultrasound transducers ("PMUTs"). Particularly where the underlying signal sources are similar and measured in a similar manner, it may be desirable to utilize common processing circuitry to process multiple underlying signal sources. Because sensors such as MEMS sensors are typically miniature components of small end-use devices that also include various other components, any reduction in processing circuitry of the sensor results in a corresponding reduction in sensor chip area and power usage. Accordingly, similar signal types (e.g., multi-axis outputs from MEMS inertial sensors, outputs from multiple microphones of a MEMS microphone array, etc.) may be interleaved (e.g., by a multiplexer) for portions of processing such as filtering, analog-to-digital conversion, decimation, gain/offset/scaling, and other necessary processing operations.

An interleaved cascaded integrator-comb ("CIC") filter may process the interleaved signals to provide filtering and perform decimation of the underlying signal. Rather than independently processing each of the N underlying interleaved signals using a separate CIC filter, an interleaved CIC filter includes internal buffering and control signals that allow the complete interleaved signal to be processed and output as a decimated version of the interleaved signal, without duplication of integrator or comb circuitry. The interleaved CIC filter buffers portions of the underlying signals of the interleaved signal and selectively processes those signal portions, and outputs the interleaved buffered portions of the signals at a reduced clock rate in accordance with a decimation rate of the interleaved CIC filter. For example, at a decimation rate equal to four, every fourth portion of the underlying signals of the received interleaved signal will be buffered and processed by the interleaved CIC filter, and the clock rate of the interleaved buffered portions of the signals output from the CIC filter will be one fourth the input clock rate of the interleaved signals.

The interleaved operations of the interleaved CIC filter are performed by a downsampler included within the CIC circuit. Control signals within the interleaved CIC filter may control the timing and buffering of the received interleaved signals by the downsampler as well as the timing and output of the interleaved portions of the underlying buffered signals by the downsampler. For example, a "push" control signal may indicate which portions of the interleaved signal to buffer within the downsampler of the interleaved CIC filter (e.g., for a decimation rate of D, buffering every D-th underlying signal sample for each of N underlying signals). A "pop" control signal may determine the timing of providing an output of the buffered signal portions (e.g., for a decimation rate of D, outputting one of the buffered signal portions every D-th clock cycle). In this manner, only a single integrator and comb filter are needed to process signals from any N number of related signal sources.

Figure 1:
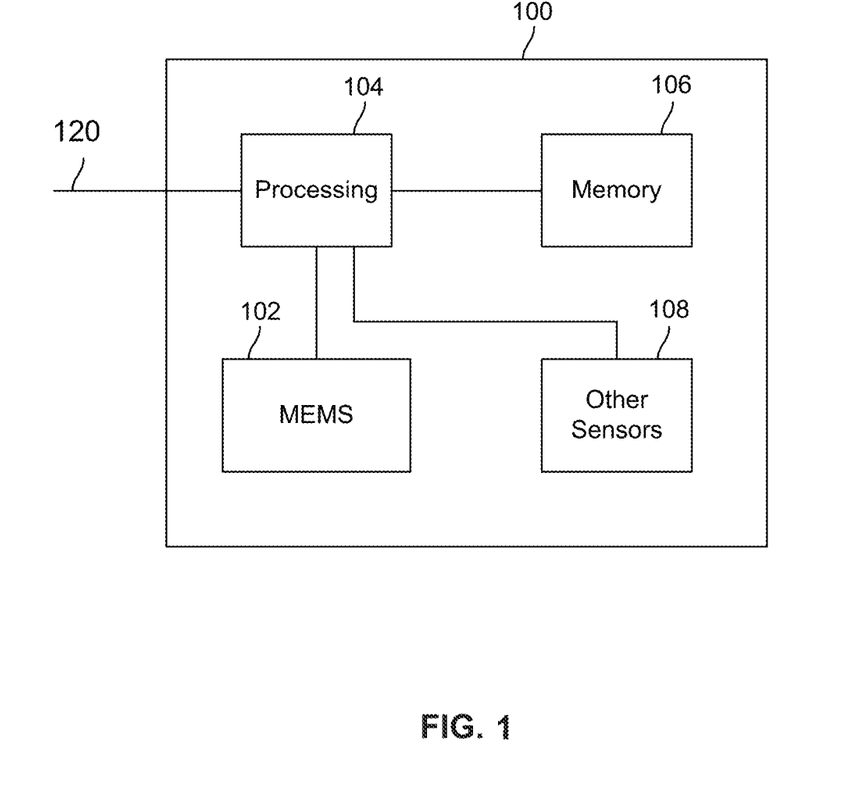
FIG. 1 shows an illustrative MEMS system in accordance with an embodiment of the present disclosure.

FIG. 1 depicts an exemplary MEMS system 100 in accordance with some embodiments of the present disclosure. Although particular components are depicted in FIG. 1, it will be understood that other suitable combinations of sensors, processing components, memory, and other circuitry may be utilized as necessary for different applications and systems. In certain embodiments of the present disclosure, the circuitry, devices, systems, and methods described herein may be described in the context of a system including multiple MEMS sensors outputting signals that are interleaved for further processing. However, it will be understood that that the circuitry, devices, systems, and methods described herein may be applied to other types of interleaved signals from a variety of other sensor types (e.g., radio antenna arrays) or other types of interleaved signals (e.g., control signals, communication signals, etc.)

In an embodiment as described herein, the MEMS system 100 may include at least a MEMS sensor 102 (e.g., a single- or multi-axis inertial sensor for measuring motion along or about one or more axes) and supporting circuitry, such as processing circuitry 104 and memory 106. In some embodiments, one or more additional sensors 108 (e.g., MEMS gyroscopes, MEMS accelerometers, MEMS microphones, MEMS pressure sensors, temperature sensors, and a compass) may be included within the motion processing system 100 to provide an integrated motion processing unit ("MPU") (e.g., including 3 axes of MEMS gyroscope sensing, 3 axes of MEMS accelerometer sensing, microphone, pressure sensor, and compass).

Processing circuitry 104 may include one or more components providing necessary processing based on the requirements of the MEMS system 100. In some embodiments, processing circuitry 104 may include hardware control logic that may be integrated within a chip of a sensor (e.g., on a substrate or capacitor of a MEMS sensor 102 or other sensor 108, or on an adjacent portion of a chip to the MEMS sensor 102 or other sensor 108) to control the operation of the MEMS sensor 102 or other sensors 108 and perform aspects of processing for the MEMS sensor 102 or other sensors 108. In some embodiments, the MEMS sensor 102 and other sensors 108 may include one or more registers that allow aspects of the operation of hardware control logic to be modified (e.g., by modifying a value of a register). In some embodiments, processing circuitry 104 may also include a processor such as microprocessor that executes software instructions, e.g., that are stored in memory 106. The microprocessor may control the operation of the MEMS sensor 102 by interacting with the hardware control logic, and process signals received from MEMS sensor 102. The microprocessor may interact with other sensors in a similar manner. In some embodiments, some or all of the functions of the processing circuitry 104, and in some embodiments, of memory 106, may be implemented on an application specific integrated circuit ("ASIC") and/or a field programmable gate array ("FPGA").

Although in some embodiments (not depicted in FIG. 1), the MEMS sensor 102 or other sensors 108 may communicate directly with external circuitry (e.g., via a serial bus or direct connection to sensor outputs and control inputs), in an embodiment the processing circuitry 104 may process data received from the MEMS sensor 102 and other sensors 108 and communicate with external components via a communication interface 110 (e.g., a SPI or I2C bus, in automotive applications a controller area network (CAN) or Local Interconnect Network (LIN) bus, or in other applications suitable wired or wireless communications interfaces as is known in the art). The processing circuitry 104 may convert signals received from the MEMS sensor 102 and other sensors 108 into appropriate measurement units (e.g., based on settings provided by other computing units communicating over the communication bus 110) and perform more complex processing to determine measurements such as orientation or Euler angles, and in some embodiments, to determine from sensor data whether a particular activity (e.g., walking, running, braking, skidding, rolling, etc.) is taking place. In some embodiments, some or all of the conversions or calculations may take place on the hardware control logic or other on-chip processing of the MEMS sensor 102 or other MEMS sensors 108.

In some embodiments, certain types of information may be determined based on data from multiple MEMS inertial sensors 102 and other sensors 108, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

Processing circuitry 104 of the MEMS sensor 102 may generate a combined signal including multiple measurement signals (e.g., a multiplexer interleaving outputs from multiple axes of an inertial sensor) interleaved for further processing. The interleaved signal may undergo further processing steps (e.g., filtering, A/D conversion, etc.) as the combined signal, thus avoiding duplication of processing circuitry and operations. In an embodiment a CIC filter implementing a decimator may directly process the interleaved signal, avoiding duplication of internal CIC circuitry such as integrators and comb filters.

Figure 2:
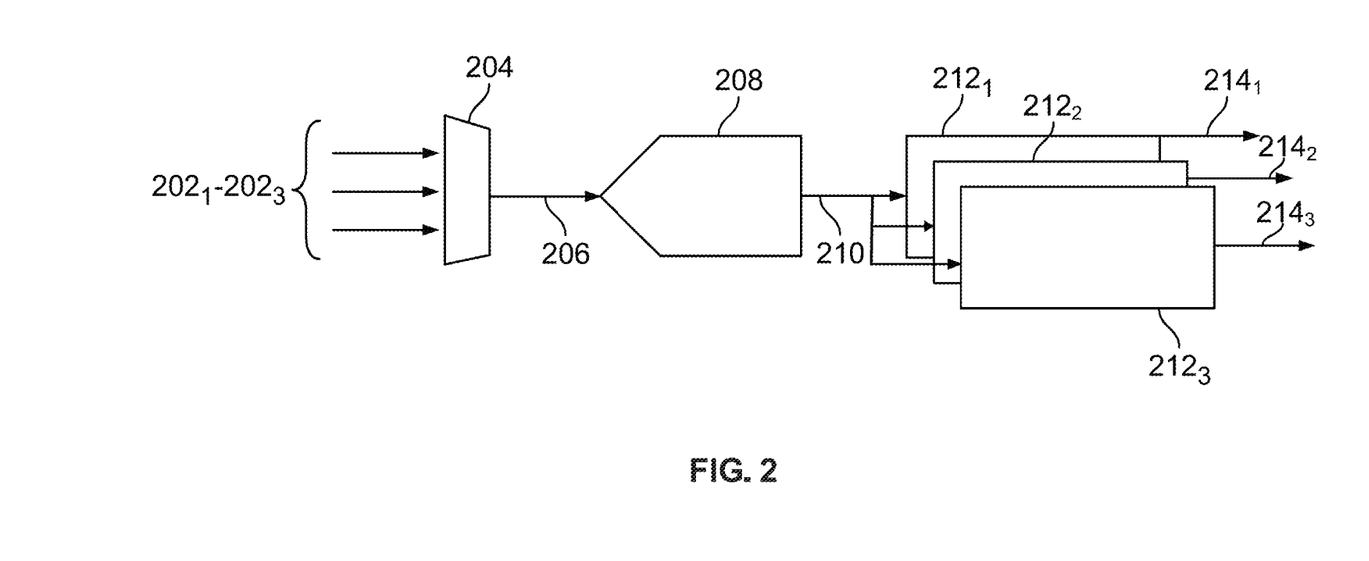
FIG. 2 shows an illustrative block diagram of processing circuitry in accordance with an embodiment of the present disclosure.

FIG. 2 shows an illustrative block diagram of processing circuitry in accordance with an embodiment of the present disclosure. In the depicted embodiment, the processing circuitry may be in the processing path of a sensor, such as a MEMS sensor, that may receive an array of analog signals received by the MEMS sensor, interleave the multiple signals into one signal, convert the interleaved analog signal to a digital format, and decimate (i.e., reduce the sample rate of) the interleaved digital signal by a decimation rate. Exemplary processing circuitry may include a multiplexer 204, an ADC 208, and cascaded integrator-comb (CIC) filters $212_1$-$212_3$ in parallel alignment, although the particular circuit elements may be modified, removed, added, or substituted.

The MEMS sensor measures a physical or electrical quantity and transmits the sensed measurements as analog MEMS signals $202_1$-$202_3$. For example, a 3-axis MEMS accelerometer may transmit signals representative of three axes of acceleration (x-axis, y-axis, and z-axis) as three separate signals (e.g., time-varying analog signals) to the multiplexer 204 (MUX). Although described in the context of three axes of acceleration signals, it will be understood that other signal types (e.g., microphone, pressure, angular velocity, etc.) may be received as well as other quantities of signals. For example, the analog MEMS signals may comprise an array of microphone signals. As another example, the analog MEMS signals $202_1$-$202_3$ may comprise multiple types of signals (e.g., samples simultaneously received from a gyroscope and an accelerometer).

The multiplexer 204 (MUX) receives the analog MEMS signals $202_1$-$202_3$ and combines them in a suitable manner according to the type of MUX, such as combing the signals as a function of time. For example, the MUX 204 may receive three axes of acceleration (x-axis, y-axis, and z-axis) as three separate signals and interleave them into an interleaved analog MEMS signal 206. The sampling rate of the underlying analog signals may be such that the interleaved signal includes adequate information for processing and measuring the underlying phenomena represented by the analog signals, despite a portion of the underlying analog signals being modified such as by including only a portion of each of the underlying analog signals in the interleaved analog signal output by MUX 204. The interleaved analog MEMS signal 206 may comprise portions of each of the input analog signals (e.g., portions of three axes of acceleration (x-axis, y-axis, and z-axis) from the 3-axis MEMS accelerometer) and may further serve as an input to the ADC 208.

The ADC 208 converts analog signals (e.g., sound, light, acceleration) into digital signals having discrete values based on a number of bits and associated with particular sampling time periods (e.g., based on a clock). The ADC 208 receives the interleaved analog MEMS signal 206 and convert it to an interleaved digital MEMS signal 210. The interleaved digital MEMS signal 210 is output from the ADC 208 and may comprise portions of digital signals (e.g., corresponding to the portions of three axes of acceleration (x-axis, y-axis, and z-axis) from the 3-axis MEMS accelerometer) that are provided to additional processing circuitry, such as CIC filters. In some embodiments (not depicted in FIG. 2), additional processing steps (e.g., filtering, automatic gain control, etc.) may be performed prior to providing the interleaved digital MEMS signal 210 to CIC filters.

In the embodiment of FIG. 2, a standard CIC filter separately processes each of the portions of the interleaved signal (e.g., corresponding to each of the underlying signals), requiring duplication of the CIC circuitry (e.g., integrators and comb filters). For an exemplary interleaved signal including three axes of acceleration signals, three CIC filters $212_1$-$212_3$ each receive the interleaved digital MEMS signal 210. The three CIC filters $212_1$-$212_3$ may be in a parallel orientation and may function to decimate the interleaved signal into respective decimated signals $214_1$-$214_3$, corresponding to respective input signals $202_1$-$202_3$. For example, each of the three CIC filters $212_1$-$212_3$ in parallel may receive the interleaved digital MEMS signal 210 comprising portions of three axes of acceleration (x-axis, y-axis, and z-axis) from the 3-axis MEMS accelerometer and output a respective portion of the decimated signals $214_1$-$214_3$. The number of parallel CIC filters $212_1$-$212_3$ may correlate to the number of underlying input signals. For example, two input signals may require two parallel CIC filters. Each CIC filter may be independent, each of which takes up a particular area and entails accompanying power consumption. The portions of the decimated signals $214_1$-$214_3$ may comprise the appropriate portions of the interleaved digital MEMS signal 210 output at a frequency in accordance with a decimation rate D (e.g., input clock rate/D) of the CIC filters $212_1$-$212_3$.

Figure 3:
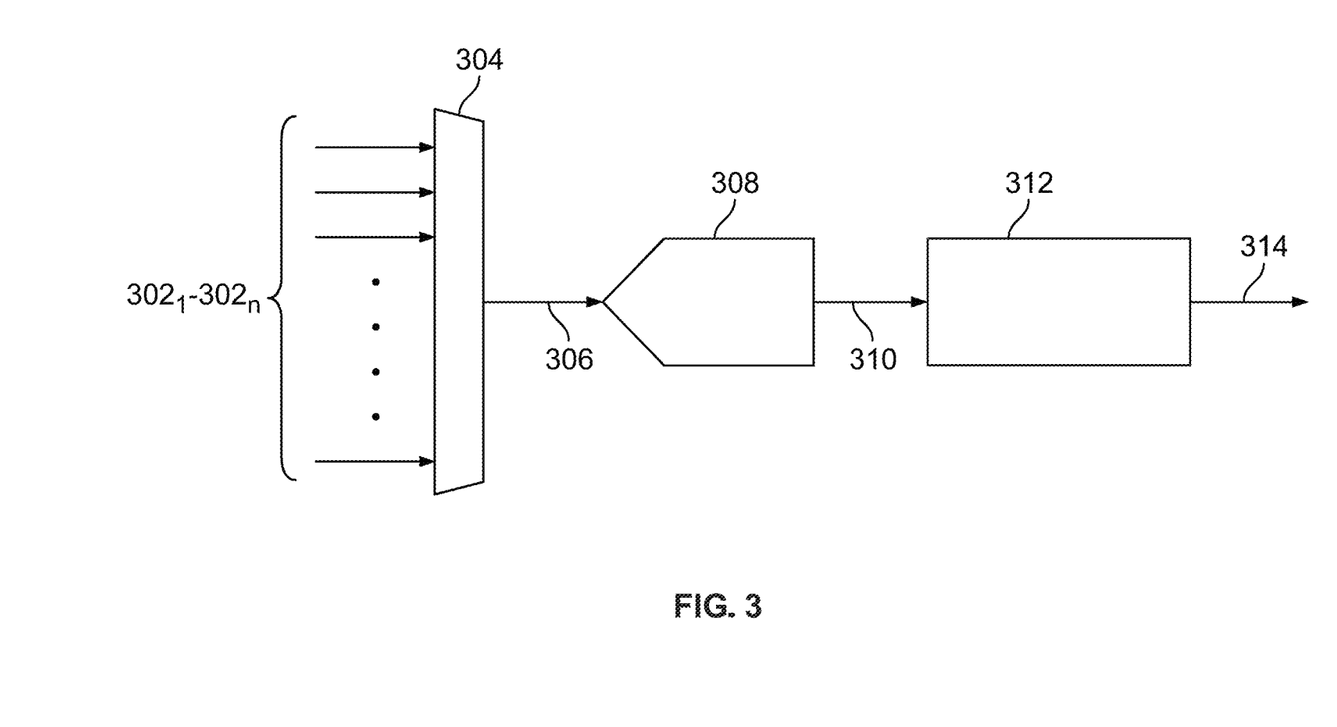
FIG. 3 shows an illustrative block diagram of processing circuitry including an interleaved CIC filter in accordance with an embodiment of the present disclosure.

FIG. 3 shows an illustrative block diagram of processing circuitry including an interleaved CIC filter 312 in accordance with an embodiment of the present disclosure. In the depicted embodiment, the processing circuitry may be in the processing path of a sensor, such as a MEMS sensor, that may receive an array of analog signals received by the MEMS sensor, interleave the multiple signals into one signal, convert the interleaved analog signal to a digital format, and decimate (i.e., reduce the sample rate of) the interleaved digital signal by a decimation rate. Exemplary processing circuitry may include a multiplexer 304, an ADC 308, and an interleaved cascaded integrator-comb (CIC) filter 312, although the particular circuit elements may be modified, removed, added, or substituted.

The MEMS sensor (e.g., accelerometer, gyroscope, microphone, pressure sensor, ultrasonic sensor) measures a physical or electrical quantity and transmits the sensed measurements as analog MEMS signals $302_1$-$302_n$. For example, a multi-axis sensor or multiple sensor may transmit N signals representative of a phenomena of interest (e.g., a microphone array, multiple axes of inertial sensing, ultrasonic signals, etc.) to the multiplexer 304 (MUX). For example, the analog MEMS signals $302_1$-$302_n$ may comprise an array of microphone signals. As another example, the analog MEMS signals $302_1$-$302_n$ may comprise multiple types of signals (e.g., samples simultaneously received from a gyroscope and an accelerometer).

The multiplexer 304 receives the N analog MEMS signals $302_1$-$302_n$ and combines them in a suitable manner according to the type of multiplexer. For example, the MUX 304 may receive N analog signals and interleave them into an interleaved analog signal 306 by extracting a 1/n portion of each of the N analog MEMS signals $302_1$-$302_n$, where the underlying sampling rate corresponding to the analog signals is adequate to capture the underlying information in spite of the signals being interleaved, although other forms of multiplexing may be utilized in other embodiments. The interleaved analog MEMS signal 306 may comprise portions of each of the N analog MEMS signals $302_1$-$302_n$ (e.g., portions of signals from each of a plurality of MEMS microphones of an array of MEMS microphones) and may output the interleaved analog signal to additional processing circuitry, such to ADC 308.

The ADC 308 converts analog signals (e.g., sound, light, acceleration) into digital signals having discrete values based on a number of bits and associated with particular sampling time periods (e.g., based on a clock). The ADC 308 may receive the interleaved analog MEMS signal 306 and convert it to an interleaved digital MEMS signal 310. The interleaved digital MEMS signal 310 may serve as an output from the ADC 308 and may comprise portions of digital signals (e.g., corresponding to the portions of N underlying signals) that are provided as portions to additional processing circuitry, such as the interleaved CIC filter 312. In some embodiments (not depicted in FIG. 4), additional processing steps (e.g., filtering, automatic gain control, etc.) may be performed prior to providing the interleaved digital MEMS signal 310 to the interleaved CIC filter 312.

The interleaved CIC filter 312 receives the interleaved digital MEMS signal 310 and outputs a decimated interleaved signal 314. The interleaved CIC filter 312 may integrate, downsample, comb filter, and output the decimated interleaved signal 314. For example, the interleaved CIC filter 312 may receive the interleaved digital MEMS signal 310 comprising portions of N underlying signals and output the decimated interleaved signal 314 including the same N underlying signals but decimated according to a decimation rate D. In some embodiments, the interleaved CIC filter 312 may take up less area, and the decimation rate (D) may be modified at runtime. The decimated interleaved signal 314 may include particular portions of the interleaved digital MEMS signal 310 output as a single interleaved signal and at a frequency in accordance with a decimation rate D (e.g., input clock rate/D) of the interleaved CIC filter, as described herein. In this manner, only a single interleaved CIC filter 312 is required for N input signals and a decimated interleaved signal 314 is output as a single interleaved digital signal including necessary information for further processing (e.g., based on underlying sampling rates of the N analog signals and the ADC 308 clock rate providing enough information for a further decimated signal to have a sampling rate sufficient for further processing).

Figure 4:
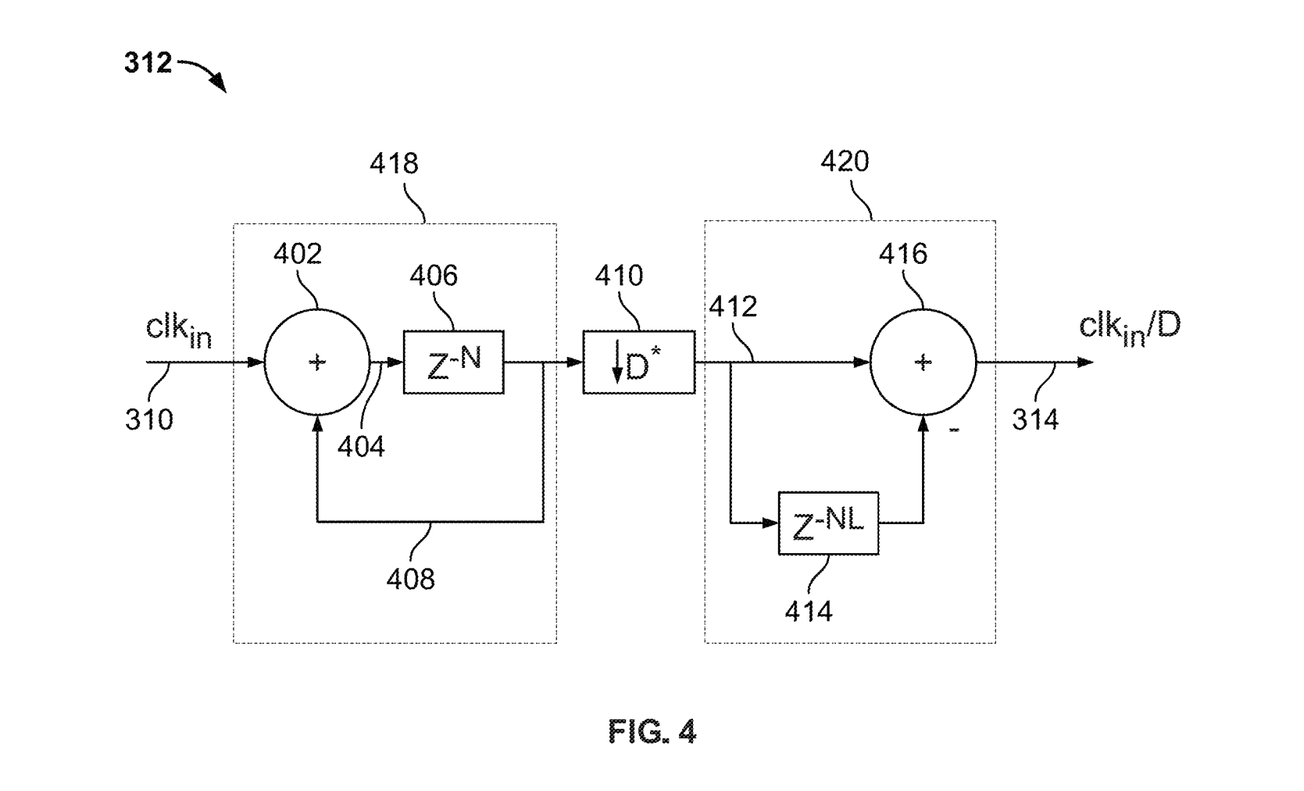
FIG. 4 shows an illustrative interleaved CIC filter in accordance with an embodiment of the present disclosure.

FIG. 4 shows the illustrative interleaved CIC filter 312 in accordance with an embodiment of the present disclosure. In the depicted embodiment, the interleaved CIC filter 312 includes an integrator 418, downsampler 410, and comb filter 420, although additional components may be added or component order may be modified (e.g., by swapping the respective locations of the integrator 418 and comb filter 420 for an interpolator) for particular CIC filter applications. In the embodiment depicted in FIG. 4, the integrator 418, downsampler 410, and comb filter 420 may collectively make up the interleaved CIC filter 312 to produce the decimated interleaved signal 314 from the received interleaved digital signal 310.

The interleaved digital signal 310 serves as an input to the interleaved CIC filter 312, and has an input clock rate associated with the underlying sampling rate and the clock rate of the ADC. The interleaved digital signal 310 includes interleaved portions of digital signals (e.g., corresponding to the respective portions of N underlying digital signals). The interleaved CIC filter 312 may integrate, downsample, and comb filter the interleaved digital signal 310 to output the decimated interleaved signal 314. For example, the interleaved CIC filter 312 may receive the interleaved digital signal 310 comprising portions of N digital signals from a plurality of respective underlying signal sources and output the decimated interleaved signal 314, which includes processed aspects of the portions of the N digital signals, having a reduced frequency in accordance with a decimation rate D. The decimated interleaved signal 314 may comprise the interleaved digital signal 310 output at a decimation rate (e.g., input clock rate/D). For example, the interleaved digital signal 310, comprising portions of N digital signals from the N signal sources, with a decimation rate equal to four may output an interleaved signal with one fourth the frequency of the input interleaved digital signal 310.

The integrator 418 of the interleaved CIC filter 312 comprises an adder 402 and a shift register 406. Although an integrator may be configured in other manners, in an embodiment the adder 402 may receive as an input the interleaved digital signal 310 and as feedback from the shift register 406 an integrated interleaved digital signal 408. The adder 402 combines the interleaved digital signal 310 and the integrated interleaved digital signal 408, accumulating portions of interleaved digital signals by adding them together with delayed versions provided via shift register 406. For example, the adder 402 may add portions of the interleaved digital signal 310 to portions of an integrated interleaved digital signal 408 to produce a feedback-modified interleaved digital MEMS signal 404. The feedback-modified interleaved digital signal 404 may serve as an output of the adder 402 and feed into the integrator's 418 shift register 406. The shift register 406 may have a delay of N, which may correspond to the total N number of underlying digital signals interleaved within the interleaved digital signal 310. The shift register 406 with the delay of N stores and delays outputs of portions of the feedback-modified interleaved digital MEMS signal 404. For example, the shift register 406 stores the N portions of the feedback-modified interleaved digital MEMS signal 404 and delay the output of those portions according to the N=n value of the shift register 406. For example, a shift register 406 delay with N=n where N corresponds to 6 input signals may be longer than the shift register 406 delay with 3 input signals. The integrated interleaved digital signal 408 serves as an output of adder 402 via a feedback loop and to downsampler 410.

Downsampler 410 reduces the sampling/clock rate of the integrated interleaved digital signal 408 according to a decimation rate D (depicted as D* in FIG. 4). Although the downsampler 410 may decimate a received signal in a variety manners, in an embodiment the downsampler 410 may selectively buffer portions of each of the underlying signals included in the interleaved signals, outputting the buffered portions at a rate that is reduced according to the decimation rate D, as described in herein. Examples of downsampler 410 architectures include a first-in-first-out (FIFO) buffer 410a, shift register 410b, and ramp 410c, which reduce the sample-rate of the integrated interleaved digital signal 408 by buffering portions of the underlying digital signals and discarding other portions of the underlying digital signals. Buffering within the downsampler 410 and any architectures thereof may be provided by a storage element which may be implemented in a variety of suitable manners, such as random access memory (RAM), flip-flops, and other storage techniques. In some embodiments, the interleaved CIC filter and other processing circuitry may be implemented in an FPGA.

The decimation rate D, input clock rate, and underlying sampling rate of the sensor may be selected such that the decimated signal (e.g., digitized based on the clock rate and decimated based on the decimation rate) retains adequate information for further processing. Operation of downsampler 410 is described in more detail herein, for example, with respect to FIGS. 5-7. Once the downsampler 410 has downsampled the integrated interleaved digital signal 408 in accordance with the decimation rate, the downsampler outputs downsampled portions of the digital signals 412 as an interleaved signal in accordance with the input clock rate divided by the decimation rate. The downsampled portions of the digital signals 412 are provided as an output to comb filter 420.

The comb filter 420 comprises a subtractor 416 and a shift register 414. Although a comb filter may be configured in other manners, in an embodiment the subtractor 416 may receive as an input the downsampled portions of the digital signals 412 and as a subtractor input a delayed version of the downsampled portions of the digital signals 412 from shift register 414. In this manner, the comb filter 420 may filter the downsampled portions of the digital signals 412 by subtracting buffered portions of digital signals from unbuffered portions of digital signals. The shift register 414 stores the downsampled portions of the digital signals 412 has a delay of NL where N=n and corresponds to the underlying number of signal sources and L is a fractional delay (e.g., to selectively determine which prior sample of a portion of a digital signal is subtracted from the current sample). The subtractor 416 may subtract buffered portions of digital signals from unbuffered portions of digital signals to produce a derivation function. The output of the subtractor 416 of comb filter 120 is the decimated interleaved signal 314.

Figure 5:
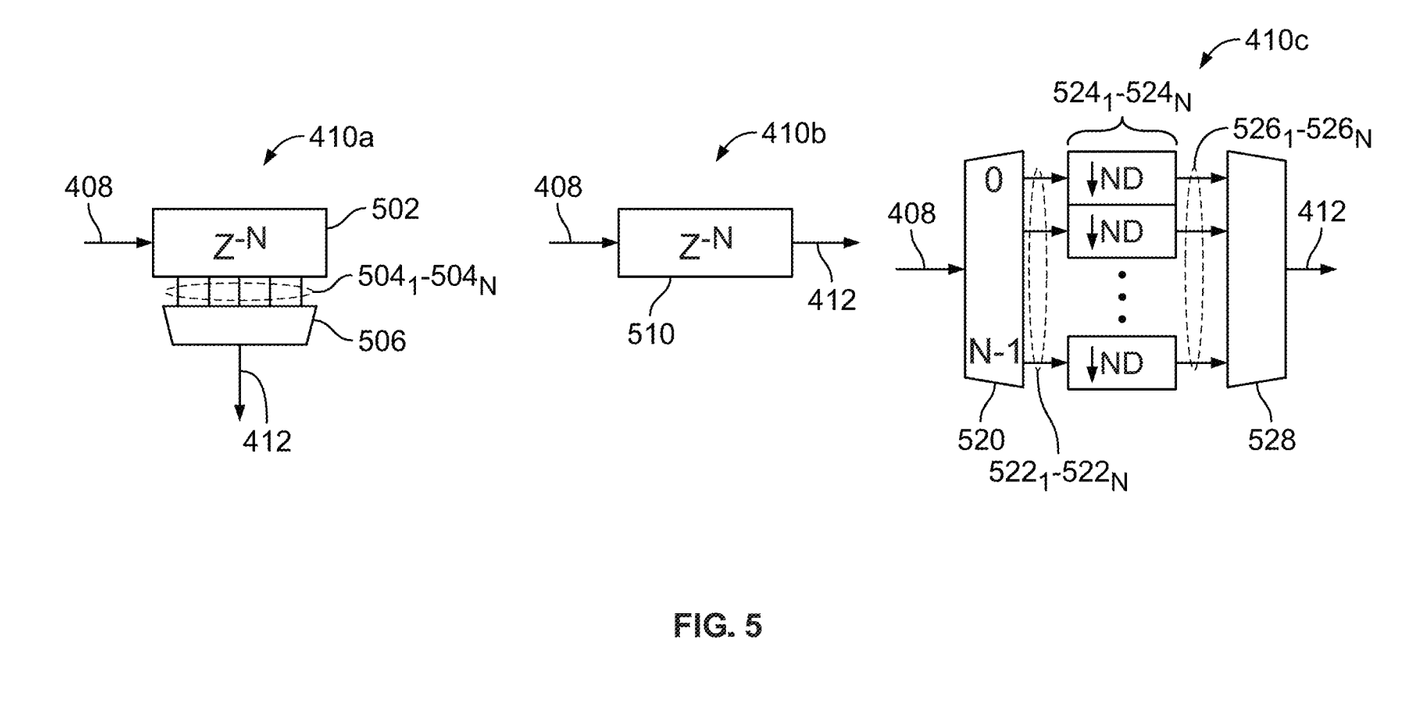
FIG. 5 shows illustrative downsamplers of an interleaved CIC filter in accordance with an embodiment of the present disclosure.

FIG. 5 shows illustrative downsampler 410 architectures of an interleaved CIC filter in accordance with embodiments of the present disclosure. Examples of downsampler 410 architectures include a the first-in-first-out (FIFO) buffer 410a, a shift register 410b, and a ramp 410c. Each of the downsamplers 410a/410b/410c reduces the sample-rate of the integrated interleaved digital signal 408 by selectively buffering portions of each of the underlying signals included in the interleaved signals, outputting the buffered portions at a rate that is reduced according to the decimation rate D. For example, an interleaved signal corresponding to N underlying signals may include the N underlying signals as a series of digital samples provided at the clock rate, with each underlying signal represented by a sample at every N clock cycles. The downsampler 410 selectively buffers only a portion of the samples for each of the underlying N signals based on the decimation rate. For example, if the decimation rate is 4, the downsampler will only buffer every fourth sample for each underlying signal. In this manner, the downsampler 410 receives the integrated interleaved digital signal 408 and outputs the downsampled portions of the digital signals 412 as an interleaved signal.

An exemplary downsampler 410 architecture is a FIFO buffer 410a, which includes a shift register 502 with a delay of N and a multiplexer (MUX) 506. The FIFO buffer 410a may receive the integrated interleaved digital signal 408 and may process portions of the integrated interleaved digital signal 408 in the order the portions are received. For example, if the FIFO buffer 410a were to receive portions of the integrated interleaved digital signal 408 in the order of x0, y0, and z0 (where x0, y0, and z0 each correspond to one of n=3 underlying signals), the FIFO buffer 410a would process the portions in the order of x0, y0, and z0. The shift register 502 with the delay of N=n may store selected portions of the integrated interleaved digital signal 408. For example, the shift register 502 may store the portions of the N underlying signals that make up the integrated interleaved digital signal 408. In some embodiments, the shift register 502 delay may correlate with a N amount of input signals. For example, the shift register 502 delay with 6 input signals may be longer than the shift register 502 delay with 3 input signals. The shift register 502 with the delay of N may selectively output buffered portions of the digital signals $504_1$-$504_n$ in accordance with the decimation rate, for example, by selectively storing or discarding portions of the received interleaved signal, such that only a subset of the received data is provided to MUX 506 via digital signals $504_1$-$504_n$. The MUX 506 receives the buffered portions of the digital signals $504_1$-$504_n$ and combines them in a suitable manner according to the type of MUX, such as a function of time. For example, the MUX 506 may receive the buffered portions of the digital signals $504_1$-$504_n$ and interleave them into the downsampled portions of the digital signals 412.

Another exemplary downsampler 410 architecture is a shift register 410b with a delay of N, which receives the integrated interleaved digital signal 408. The shift register 410b with the delay of N may store portions of the integrated interleaved digital signal 408. For example, the shift register 410b may selectively store or discard portions of the received signal 408 corresponding to each of the N underlying signals, outputting as the downsampled portions of the digital signals 412 only the stored portions of the received integrated interleaved digital signal 408. In some embodiments, the shift register 410b delay may correlate with a N=n number of input signals. For example, the shift register 410b delay with 6 input signals may be longer than the shift register 410b delay with 3 input signals. The shift register 410b may output the decimated portions of the digital signals 412 after buffering and selecting/discarding the integrated interleaved digital signal 408.

Another exemplary downsampler 410 architecture is a ramp 410c, which includes a demultiplexer (DMUX) 520, ramp shift registers $524_1$-$524_n$, and a multiplexer (MUX) 528 in an embodiment. DMUX 520 may receive the integrated interleaved digital signal 408 and split the signal into portions in a suitable manner according to the type of DMUX, such as a function of time. For example, the DMUX 520 may receive the integrated interleaved digital signal 408 corresponding to N underlying signals and split the signal into portions of digital MEMS signals $522_1$-$522_n$, i.e., one signal for each of the N underlying signals. The digital MEMS signals $522_1$-$522_n$ represent N input digital signals transmitted from the MEMS sensor (e.g., accelerometer, gyroscope, microphone, pressure sensor, ultrasonic sensor). Each of the digital MEMS signals $522_1$-$522_n$ is provided to a respective ramp shift register $524_1$-$524_n$, such that each shift register corresponds to one of the N underlying signals. The ramp shift registers $524_1$-$524_n$ have a delay (e.g. N*D, where N corresponds to the N underlying signals and D is the decimation rate) and may selectively store portions of the digital MEMS signals $522_1$-$522n$. For example, the ramp shift registers $524_1$-$524_n$ may store every D-th portion or sample of the corresponding digital MEMS signal $522_1$-$522_n$. In this manner, the ramp shift registers $524_1$-$524_n$ delay correlates with N*D (i.e., N amount of input signals times decimation rate D) and reduces the output rate in accordance with D. The ramp shift registers $524_1$-$524_n$ with the delays of ND output buffered portions of the digital signals $526_1$-$526_n$, which feed into the MUX 528. The MUX 528 receives the buffered portions of the digital signals $526_1$-$526_n$ and combines them in a suitable manner according to the type of MUX, such as a function of time. For example, the MUX 528 may receive the buffered portions of the digital signals $526_1$-$526_n$ and interleave them into the downsampled portions of the digital signals 412.

Figure 6:
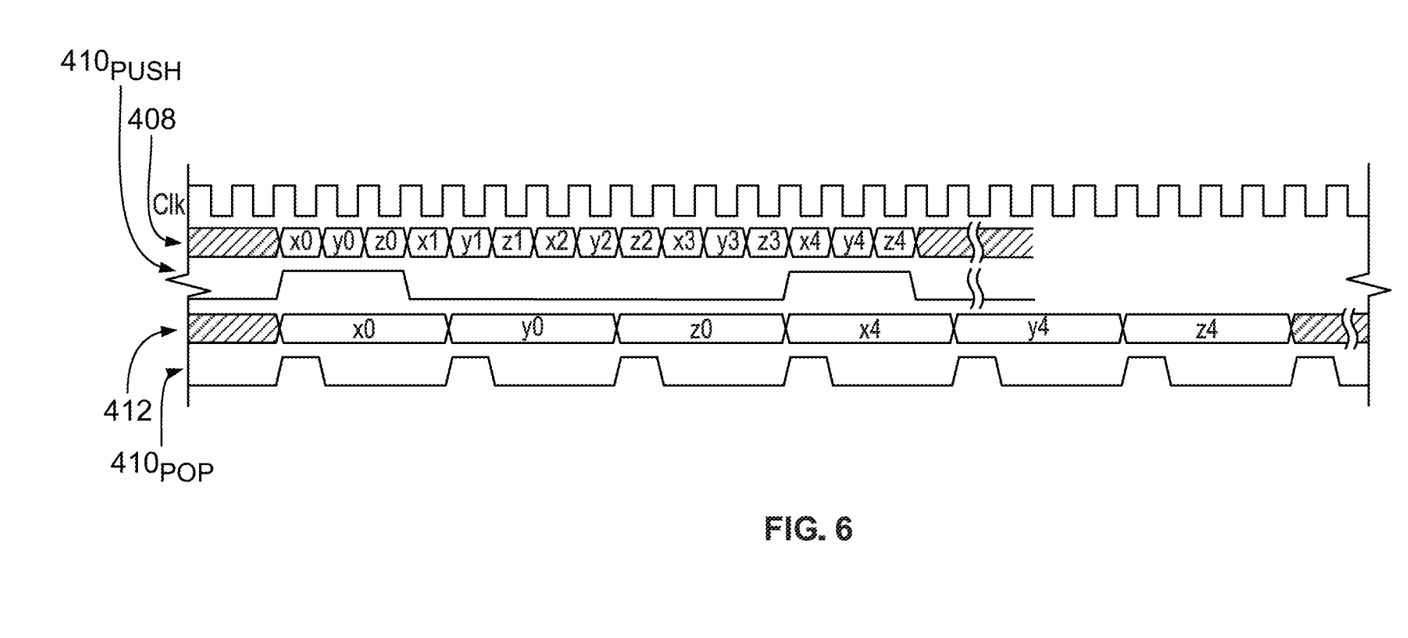
FIG. 6 shows an illustrative signal timing diagram in accordance with an embodiment of the present disclosure.

FIG. 6 shows an illustrative signal timing diagram in accordance with an embodiment of the present disclosure. In the signal timing diagram of FIG. 6, the exemplary system includes three underlying signal sources x, y, and z (e.g., corresponding to three axes of sensed linear acceleration), although it will be understood that similar timing diagrams (e.g., including proper push and pop control signal timing) will apply to different numbers of N underlying signals and D decimation rates. For example, a system having N underlying signals A/B/C/D/E/F would have a push signal that selectively buffers one subset of samples for each of the N underlying signals A/B/C/D/E/F (e.g., that spans 6 clock cycles). Similarly, a different decimation rate would result in a different frequency of the push signal to buffer (e.g., with a number of cycles for sampling the interleaved signal corresponding to the decimation rate D) as well as a different frequency of the pop signal (e.g., with the pop signal provided every D clock cycles). Further, it will be understood that to the extent that underlying sample rate of the interleaved signals differs (e.g., such that a particular sample such as x0 spans multiple clock cycles) the respective timing of the push and pop signals may similarly be adjusted.

The signal timing diagram depicts four signals for the downsampler 410 with respect to the input clock rate: the integrated interleaved digital signal 408, a push control signal for downsampler D* $410_{push}$, a pop control signal for downsampler D* $410_{pop}$, and the downsampled portions of the digital signals 412. The integrated interleaved digital signal 408 corresponds to the output of the integrator 418 that feeds into the downsampler 410, and the downsampled portions of the digital signals 412 correspond to the output of the downsampler 410 which feeds into the comb filter 420. The push control signal $410_{push}$ for downsampler $410_{push}$ directs the downsampler 410 as to which portions of each of the N underlying signals to buffer. For example, if the decimation rate were to be four, the push signal for downsampler D* $410_{push}$ may push one subset of underlying digital signal data into the buffer for every four cycles of the interleaved signals (e.g., to buffer x0, y0, and z0, but not x1, y1, z1, x2, y2, z2, x3, y3, or z3, although in other embodiments different subsets of underlying data may be sampled according to the decimation rate D, such as x1, y2, and z3). For first-in-first-out (FIFO) buffer 410a, the push control signal for downsampler D* $410_{push}$ takes place in shift register 502 and decides which portions of the integrated interleaved digital signal 408 are buffered by a delay of n. For shift register 410b, similar to FIFO buffer 410a, the push control signal for downsampler D* $410_{push}$ takes place in shift register 510 and decides which portions of the integrated interleaved digital signal 408 are buffered by a delay of n. For ramp 410c, the push control signal for downsampler D* $410_{push}$ takes place in shift registers $524_1$-$524_n$ and decides which portions of digital MEMS signals $522_1$-$522_n$ are buffered by a delay of ND.

The pop control signal for downsampler D* $410_{pop}$ determines when to extract the buffered portions of the digital signals to generate an interleaved output signal. For example, the pop control signal for downsampler D* $410_{pop}$ may generate a control signal to selectively release buffered portions of the digital signals in accordance with the decimated clock rate. For example, where signal portions x0, y0, and z0 are buffered in accordance with the push control signal $410_{push}$, a first pop control signal $410_{pop}$ output may immediately release the underlying signal portion x0 as the output downsampled portion of the digital signals 412, and x0 may continue to be provided at this output until another signal portion (e.g., a previously buffered y0 signal portion) is released via pop control signal $410_{pop}$. It will be noted that the timing of the pop control signal $410_{pop}$ corresponds to the decimation rate D, with each new signal portion released via pop control signal $410_{pop}$ at a number of clock cycles (or clock cycle intervals) equal to the decimation rate (e.g., every four clock cycles for a decimation rate equal to four in FIG. 6). Although in the embodiment the timing of the initial push and pop signal are aligned (e.g., with the initial buffering of x0 via push control signal $410_{push}$ and release of x0 via pop control signal $410_{pop}$ being substantially simultaneous), it will be understood that in some embodiments the pop control signal $410_{pop}$ can be delayed with respect to the push control signal $410_{push}$, so long as the relative timing of the downsampled portions of the digital signals 412 is maintained. With respect to the downsampler embodiments of FIG. 4, for FIFO buffer 410a, the pop control signal for downsampler D* $410_{pop}$ takes place in the MUX 506 and decides when to release the buffered portions of the digital signals $504_1$-$504_n$. For shift register 410b, the pop control signal for downsampler D* $410_{pop}$ takes place in shift register 510 and decides when to release the portions of the integrated interleaved digital signal 408. For ramp 410c, the pop control signal for downsampler D* $410_{pop}$ takes place in shift registers $524_1$-$524_n$ and decides when to release the portions of digital MEMS signals $522_1$-$522_n$.

FIG. 6 depicts a specific embodiment of a 3-axis accelerometer having signal portions for x, y, and z axes, which compose the N portions (n=3 in this figure) of the integrated interleaved digital signal 408 (e.g., x0, y0, and z0). The timing diagram operates with a decimation rate equal to 4, which the push control signal for downsampler D* $410_{push}$ conveys by buffering one portion of the integrated interleaved digital signal 408 (e.g., x0, y0, and z0) with a delay (e.g., n, ND, etc.), waiting four clock cycles, and buffering another portion of the integrated interleaved digital signal 408 (e.g., x4, y4, and z4) with a delay (e.g., n, ND, etc.). The pop control signal for downsampler D* $410_{pop}$ releases the buffered portions of the integrated interleaved digital signal 408 (i.e., the downsampled portions of the digital signals 412) according to the decimation rate. In the timing diagram, the pop control signal for downsampler D* $410_{pop}$ releases the downsampled portions of the digital signals 412 (e.g., x0, y0, and z0), waits four clock cycles, and releases another downsampled portions of the digital signals 412 (e.g., x4, y4, and z4). When releasing the downsampled portions of the digital signals 412 (e.g., x0, y0, and z0), the pop control signal for downsampler D* $410_{pop}$ pulses at the decimation rate as well.

Figure 7:
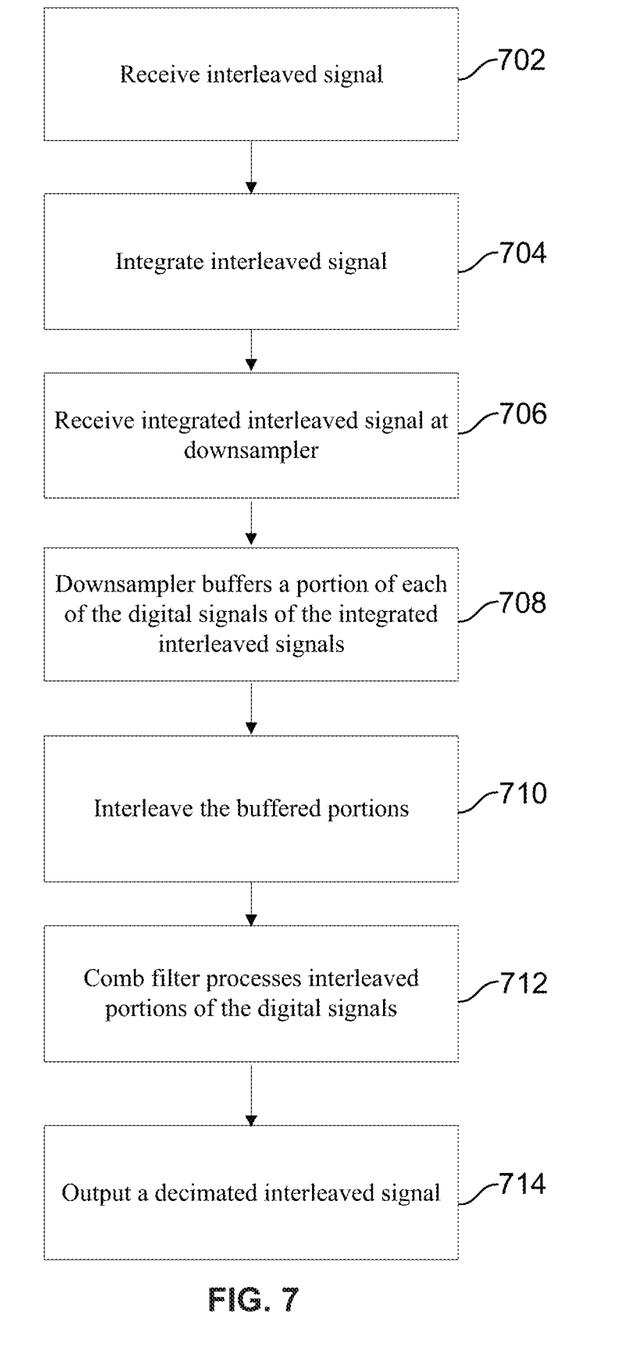
FIG. 7 shows illustrative steps of a signal processing method including an interleaved CIC filter in accordance with an embodiment of the present disclosure.

FIG. 7 shows illustrative steps of a signal processing method including an interleaved CIC filter in accordance with an embodiment of the present disclosure. Although a particular set of steps is depicted in a particular sequence in FIG. 7, it will be understood that one or more steps may be added or omitted and that the sequences of steps may be modified. Although the steps of FIG. 7 may be described within the context of the interleaved CIC filter depicted and described in FIGS. 1-6 herein, it will be understood that the present steps apply to other types of CIC filters (e.g., CIC compensation filters) that are not interleaved but rather oriented in parallel configuration, to CIC filters operating at a high or low sampling frequency, or to CIC filters with flat pass bands. It will further be understood that the steps described with respect to FIG. 7 may be performed for other interleaved signals (e.g., not from a MEMS or sensor signal source), and that the particular embodiment of FIG. 7 (e.g., related to processing of a MEMS sensor outputs) is provided for illustration only.

At step 702, an interleaved CIC filter such as interleaved CIC filter 312 receives the interleaved digital MEMS signal 310 (e.g., from an ADC or other processing circuitry). N (N=n) underlying signals (e.g., $302_1$-$302_n$) may compose the portions of interleaved digital MEMS signal 310. In some embodiments, an integrator 418 of the interleaved CIC filter 312 may receive the interleaved digital MEMS signal 310 at an input clock rate (e.g., a clock rate associated with the ADC). For example, adder 402 of integrator 418 may receive the interleaved digital MEMS signal 310 at the input clock rate. Once the interleaved signal is received, processing may continue to step 704.

At step 704, interleaved CIC filter 312 integrates the interleaved digital MEMS signal 310. N (N=n) underlying signals (e.g., $302_1$-$302_n$) may compose the portions of the interleaved digital MEMS signal 310. In some embodiments, integrator 418 may receive the interleaved digital MEMS signal 310 at the input clock rate. In particular, adder 402 may receive the interleaved digital MEMS signal 310 at the input clock rate and add portions of the interleaved digital MEMS signal 310 to portions of the integrated interleaved digital MEMS signal 408 to produce the feedback-modified interleaved digital MEMS signal 404. The feedback-modified interleaved digital MEMS signal 404 serves as an output from the adder 402 and feeds into the integrator's 418 shift register 406. In some embodiments, shift register 406 may have a delay of N, which may correspond to the total N number of underlying digital signals interleaved within the portions of the interleaved digital MEMS signal 310. For example, the shift register 406 stores the N portions of the feedback-modified interleaved digital MEMS signal 404 and delays the output of those portions according to the N=n value of the shift register 406. Shift register 406 with the delay of N may store and delay portions of the feedback-modified interleaved digital MEMS signal 404 and output the integrated interleaved digital MEMS signal 408. The integrated interleaved digital signal 408 serves as an output from shift register 406 via a feedback loop and feeds into the downsampler 410. Once the received interleaved signal has been integrated at step 704, processing may continue to step 706.

At step 706, the downsampler 410 interleaved CIC filter 312 receives the integrated interleaved digital MEMS signal 408 from the integrator 418. N (N=n) underlying signals (e.g., $302_1$-$302_n$) may compose the portions of the integrated interleaved digital MEMS signal 408. In some embodiments, first-in-first-out (FIFO) buffer 410a may receive the integrated interleaved digital MEMS signal 408 at shift register 502 with a delay of N. In some embodiments, shift register 410b with a delay of N may receive the integrated interleaved digital MEMS signal 408. In further embodiments, ramp 410c may receive the integrated interleaved digital MEMS signal 408 at demultiplexer (DMUX) 520. Whichever downsampler type receives the integrated interleaved digital MEMS signal 408, once the signal is received the processing may continue to step 708.

At step 708, downsampler 410 buffers a portion of each of the underlying digital signals within the integrated interleaved digital MEMS signal 408. N (N=n) underlying signals (e.g., $302_1$-$302_n$) may compose the portions of the integrated interleaved digital MEMS signal 408. In some embodiments, the downsampler 410 may exist as FIFO buffer 410a, including shift register 502 with a delay of N and multiplexer (MUX) 506. Shift register 502 may have a delay of N, which may correspond to the total N number of underlying digital signals interleaved within the portions of the integrated interleaved digital MEMS signal 408. Shift register 502 with the delay of N may store and delay (i.e., buffer) portions of the integrated interleaved digital MEMS signal 408. The push control signal for downsampler D* $410_{push}$ prompts the buffering which takes place in shift register 502. The push control signal for downsampler D* $410_{push}$ is provided in accordance with the designated decimation rate (e.g., such that only 1/D samples of each underlying signal are buffered). For example, if the downsampler 410 operates with a decimation rate equal to 4, the push control signal for downsampler D* $410_{push}$ buffers one portion of the integrated interleaved digital MEMS signal 408 for every four cycles in which the portion is received. In some embodiments, the downsampler 410 may exist as shift register 410b, including shift register 510 with a delay of N. Shift register 510 may have a delay of N, which may correspond to the total N number of underlying digital signals interleaved within the portions of the integrated interleaved digital MEMS signal 408. Shift register 510 with the delay of N may store and delay (i.e., buffer) portions of the integrated interleaved digital MEMS signal 408. The push control signal for downsampler D* $410_{push}$ prompts the buffering which takes place in shift register 510. The push control signal for downsampler D* $410_{push}$ is provided in accordance with the designated decimation rate (e.g., such that only 1/D samples of each underlying signal are buffered). In some embodiments, the downsampler 410 may exist as ramp 410c, including DMUX 520, shift registers $524_1$-$524_n$ with delays of ND, and MUX 528. DMUX 520 may receive the integrated interleaved digital MEMS signal 408 corresponding to N underlying signals and split the signal into portions of digital MEMS signals $522_1$-$522_n$, which may feed into shift registers $524_1$-$524_n$. Shift registers $524_1$-$524_n$ with the delays of ND may correspond to the total N number of underlying digital signals within the portions of the digital MEMS signals $522_1$-$522_n$ multiplied by the decimation rate D. Shift registers $524_1$-$524_n$ with the delays of ND may store and delay (i.e., buffer) the portions of the digital MEMS signals $522_1$-$522_n$ The push control signal for downsampler D* $410_{push}$ prompts the buffering which takes place in shift registers $524_1$-$524_n$. The push control signal for downsampler D* $410_{push}$ in provided in accordance with the designated decimation rate (e.g., such that only 1/D samples of each underlying signal are buffered). Once the downsampler has buffered the portions of the underlying digital signals, processing may continue to step 710.

At step 710, downsampler 410 interleaves the buffered portions of the integrated interleaved digital MEMS signal 408. N (N=n) underlying signals (e.g., $302_1$-$302_n$) may compose the portions of the integrated interleaved digital MEMS signal 408. In some embodiments, the downsampler 410 may exist as FIFO buffer 410a, including shift register 502 with a delay of N and multiplexer (MUX) 506. The shift register 502 with the delay of N may selectively output buffered portions of the digital signals $504_1$-$504_n$ in accordance with the decimation rate, for example, by selectively storing or discarding portions of the received interleaved signal, such that only a subset of the received data is provided to MUX 506 via digital signals $504_1$-$504_n$. The MUX 506 receives the buffered portions of the digital signals $504_1$-$504_n$ and interleaves them in a suitable manner according to the type of MUX, such as a function of time. The pop control signal for downsampler D* $410_{pop}$ takes place in the MUX 506 and decides when to release the buffered portions of the digital signals $504_1$-$504_n$. The pop control signal for downsampler D*$410_{pop}$ selectively releases the buffered portions of the digital signals $504_1$-$504_n$ in accordance with the decimated clock rate. For example, where signal portions (e.g., $302_1$-$302_n$) of the integrated interleaved digital MEMS signal 408 are buffered in accordance with the push control signal $410_{push}$, a first pop control signal $410_{pop}$ output may immediately release the underlying signal portion (e.g., $302_1$) as the output downsampled portion of the digital signals 412, releasing the next signal portion after D clock cycles. In some embodiments, the downsampler 410 may exist as shift register 410b, including shift register 510 with a delay of N. The shift register 510 with the delay of N may store portions of the integrated interleaved digital MEMS signal 408. For example, the shift register 510 may selectively store or discard portions of the received signal 408 corresponding to each of the N underlying signals, outputting as the downsampled portions of the digital signals 412 only the stored portions of the received integrated interleaved digital signal 408. The pop control signal for downsampler D* $410_{pop}$ takes place in shift register 510 and decides when to release the portions of the integrated interleaved digital MEMS signal 408. The pop control signal for downsampler D* $410_{pop}$ selectively releases the buffered portions of the integrated interleaved digital MEMS signal 408 in accordance with the decimated clock rate, as described herein. In some embodiments, the downsampler 410 may exist as ramp 410c, including DMUX 520, shift registers $524_1$-$524_n$ with delays of ND, and MUX 528. DMUX 520 may receive the integrated interleaved digital MEMS signal 408 corresponding to N underlying signals and split the signal into portions of digital MEMS signals $522_1$-$522_n$, which may feed into shift registers $524_1$-$524_n$. Each of the digital MEMS signals $522_1$-$522_n$ is provided to a respective ramp shift register $524_1$-$524_n$, such that each shift register corresponds to one of the N underlying signals. The ramp shift registers $524_1$-$524_n$ may have a delay (e.g. N*D, where N corresponds to the N underlying signals and D is the decimation rate) and may selectively store portions of the digital MEMS signals $522_1$-$522_n$. The pop control signal for downsampler D* $410_{pop}$ takes place in shift registers $524_1$-$524_n$ and decides when to release the portions of digital MEMS signals $522_1$-$522_n$. The pop control signal for downsampler D* $410_{pop}$ selectively releases the portions of the digital MEMS signals $522_1$-$522_n$ in accordance with the decimated clock rate to produce the buffered portions of the digital signals $526_1$-$526_n$. The MUX 528 receives the buffered portions of the digital signals 526-$526_n$ and interleaves them in a suitable manner according to the type of MUX, such as a function of time. Once the buffered portions of the digital signals have been interleaved by the downsampler at step 710, the resulting portions of the digital signals may be provided to the other processing circuitry and processing may continue to step 712.

At step 712, comb filter 420 processes the interleaved portions of the digital signals 412. N (N=n) underlying signals (e.g., $302_1$-$302_n$) may compose the interleaved portions of the digital signals 412. In some embodiments, shift register 414 with a delay of NL may receive the interleaved portions of the digital signals 412. The shift register 414 may store the interleaved portions of the digital signals 412 with the delay of NL where N=n and corresponds to the underlying number N signal sources and L is a fractional delay (e.g., to selectively determine which prior sample of a portion of a digital signal is subtracted from the current sample). In some embodiments, subtractor 416 may process the interleaved portions of the digital signals 412 by subtracting buffered portions of digital signals from unbuffered portions of digital signals to produce a decimated interleaved signal 314 at the decimation rate (e.g., input clock rate/D). Processing may then continue to step 714, at which interleaved CIC filter 312 outputs a decimated interleaved signal 314 at the decimation rate (e.g., input clock rate/D).

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A device for processing interleaved signals, comprising:
   an integrator configured to receive an interleaved signal and output an integrated interleaved signal, wherein the interleaved signal comprises a plurality of digital signals interleaved at an input clock rate;
   a downsampler coupled to the integrator to receive the integrated interleaved signal and buffer a portion of each of the digital signals of the integrated interleaved signal; and
   a comb filter coupled to the downsampler to receive the portions of the digital signal and to output a decimated interleaved signal corresponding to the portions of the digital signals interleaved at clock rate corresponding the input clock rate divided by a decimation rate, wherein the downsampler comprises a first-in first-out (FIFO) buffer, and wherein a number of storage elements of the FIFO buffer corresponds to the number of the plurality of digital signals, and wherein the portions of each of the digital signals are based on the decimation rate.

2. The device of claim 1, wherein the downsampler comprises a shift register, and wherein a latency of the shift register corresponds to the number of the plurality of digital signals, and wherein the portions of each of the digital signals are based on the decimation rate.

3. The device of claim 1, wherein the downsampler comprises a ramp, and wherein a number of storage elements of the ramp corresponds to the number of the plurality of digital signals, and wherein the portions of each of the digital signals are based on the decimation rate.

4. The device of claim 1, wherein the integration is based on a number of the plurality of digital signals.

5. The device of claim 4, wherein each portion is based on the decimation rate and the number of the plurality of digital signals.

6. The device of claim 5, wherein the comb filter processes the received portions of the digital signals based on the number of the plurality of digital signals.

7. The device of claim 6, wherein the comb filter processes the received portions of the digital signals based on the number of the plurality of digital signals and a differential delay.

8. The device of claim 1, wherein the plurality of digital signals correspond to respective output signals from each of a plurality of microelectromechanical systems (MEMS) sensors.

9. The device of claim 8, wherein the plurality of MEMS sensors comprise a plurality of MEMS microphones.

10. The device of claim 8, wherein the plurality of MEMS sensors comprise a plurality of MEMS inertial sensors.

11. The device of claim 1, wherein the downsampler comprises a storage element, and wherein the storage element comprises random access memory (RAM).

12. The device of claim 1, wherein the downsampler comprises a storage element, and wherein the storage element comprises a plurality of flip flops.

13. The device of claim 1, wherein the device is implemented within a field programmable gate array (FPGA).

14. A method for processing interleaved signals, comprising:
receiving, at an integrator, an interleaved signal comprising a plurality of digital signals interleaved at an input clock rate;
integrating, by the integrator, the interleaved signal to generate an integrated interleaved signal;
receiving, at a downsampler, the integrated interleaved signal;
buffering, by the downsampler, a portion of each of the digital signals of the integrated interleaved signal;
interleaving, at the downsampler, the portions of the digital signal at a decimated clock rate corresponding the input clock rate divided by a decimation rate, wherein the downsampler comprises a ramp, and wherein a number of storage elements of the ramp corresponds to the number of the plurality of digital signals, and wherein the portions of each of the digital signals are based on the decimation rate;
receiving, at a comb filter, the interleaved portions of the digital signals;
filtering, by the comb filter, the interleaved portions of the digital signals; and
outputting, from the comb filter, a decimated interleaved signal based on the filtered interleaved portions of the digital signals.

15. The method of claim 14, wherein the downsampler comprises a first-in first-out (FIFO) buffer, and wherein a number of storage elements of the FIFO buffer corresponds to the number of the plurality of digital signals, and wherein the portions of each of the digital signals are based on the decimation rate.

16. The method of claim 14, wherein the downsampler comprises a shift register, and wherein a latency of the shift register corresponds to the number of the plurality of digital signals, and wherein the portions of each of the digital signals are based on the decimation rate.

17. The method of claim 14, wherein the integration is based on a number of the plurality of digital signals.

18. A device for processing interleaved signals, comprising:
an integrator configured to receive an interleaved signal and output an integrated interleaved signal, wherein the interleaved signal comprises a plurality of digital signals interleaved at an input clock rate;
a downsampler coupled to the integrator to receive the integrated interleaved signal and buffer a portion of each of the digital signals of the integrated interleaved signal; and
a comb filter coupled to the downsampler to receive the portions of the digital signal and to output a decimated interleaved signal corresponding to the portions of the digital signals interleaved at clock rate corresponding the input clock rate divided by a decimation rate, wherein the downsampler comprises a ramp, and wherein a number of storage elements of the ramp corresponds to the number of the plurality of digital signals, and wherein the portions of each of the digital signals are based on the decimation rate.

19. A method for processing interleaved signals, comprising:
receiving, at an integrator, an interleaved signal comprising a plurality of digital signals interleaved at an input clock rate;
integrating, by the integrator, the interleaved signal to generate an integrated interleaved signal;
receiving, at a downsampler, the integrated interleaved signal;
buffering, by the downsampler, a portion of each of the digital signals of the integrated interleaved signal;
interleaving, at the downsampler, the portions of the digital signal at a decimated clock rate corresponding the input clock rate divided by a decimation rate, wherein the downsampler comprises a first-in first-out (FIFO) buffer, and wherein a number of storage elements of the FIFO buffer corresponds to the number of the plurality of digital signals, and wherein the portions of each of the digital signals are based on the decimation rate;
receiving, at a comb filter, the interleaved portions of the digital signals;
filtering, by the comb filter, the interleaved portions of the digital signals; and
outputting, from the comb filter, a decimated interleaved signal based on the filtered interleaved portions of the digital signals.

* * * * *